United States Patent
Elers

(10) Patent No.: US 7,598,170 B2
(45) Date of Patent: Oct. 6, 2009

(54) PLASMA-ENHANCED ALD OF TANTALUM NITRIDE FILMS

(75) Inventor: Kai-Erik Elers, Vantaa (FI)

(73) Assignee: ASM America, Inc., Phoenix, AZ (US)

( * ) Notice: Subject to any disclaimer, the term of this patent is extended or adjusted under 35 U.S.C. 154(b) by 0 days.

(21) Appl. No.: 11/627,749

(22) Filed: Jan. 26, 2007

(65) Prior Publication Data

US 2008/0182411 A1 Jul. 31, 2008

(51) Int. Cl.
*H01L 21/44* (2006.01)

(52) U.S. Cl. ............... 438/656; 257/E21.584; 257/E21.586; 438/648; 438/653; 438/681

(58) Field of Classification Search ........... 438/493, 438/680, 683, 584, 648, 653, 656, 681; 257/E21.584, 257/E21.586
See application file for complete search history.

(56) References Cited

U.S. PATENT DOCUMENTS

| | | | |
|---|---|---|---|
| 4,058,430 A | 11/1977 | Suntola et al. |
| 4,282,267 A | 8/1981 | Kuyel |
| 4,389,973 A | 6/1983 | Suntola et al. |
| 4,747,367 A | 5/1988 | Posa |
| 4,761,269 A | 8/1988 | Conger et al. |
| 4,767,494 A | 8/1988 | Kobayashi et al. |
| 4,851,095 A | 7/1989 | Scobey et al. |
| 4,935,661 A | 6/1990 | Heinecke et al. |
| 5,071,670 A | 12/1991 | Kelly |
| 5,166,092 A | 11/1992 | Mochizuki et al. |
| 5,221,556 A | 6/1993 | Hawkins et al. |
| 5,270,247 A | 12/1993 | Sakuma et al. |
| 5,342,652 A | 8/1994 | Foster et al. |
| 5,356,673 A | 10/1994 | Schmitt et al. |
| 5,443,647 A | 8/1995 | Aucoin et al. |
| 5,618,395 A | 4/1997 | Gartner |
| 5,691,235 A | 11/1997 | Meikle et al. |
| 5,693,139 A | 12/1997 | Nishizawa et al. |
| 5,711,811 A | 1/1998 | Suntola et al. |
| 5,723,384 A | 3/1998 | Park et al. |
| 5,769,950 A | 6/1998 | Takasu et al. |

(Continued)

FOREIGN PATENT DOCUMENTS

EP     0 442 490 A1     12/1991

(Continued)

OTHER PUBLICATIONS

Elers et al., NbC15 as a precursor in atomic layer epitaxy, Applied Surface Science, 82/83:468-474 (1994).

(Continued)

*Primary Examiner*—Asok K Sarkar
(74) *Attorney, Agent, or Firm*—Knobbe, Martens Olson & Bear, LLP

(57) ABSTRACT

Methods of controllably producing conductive tantalum nitride films are provided. The methods comprise contacting a substrate in a reaction space with alternating and sequential pulses of a tantalum source material, plasma-excited species of hydrogen and nitrogen source material. The plasma-excited species of hydrogen reduce the oxidation state of tantalum, thereby forming a substantially conductive tantalum nitride film over the substrate. In some embodiments, the plasma-excited species of hydrogen react with and removes halide residues in a deposited metallic film.

19 Claims, 1 Drawing Sheet

U.S. PATENT DOCUMENTS

| | | | |
|---|---|---|---|
| 5,855,680 | A | 1/1999 | Soininen et al. |
| 5,916,365 | A | 6/1999 | Sherman |
| 5,961,365 | A | 10/1999 | Lambert |
| 5,973,400 | A | 10/1999 | Murakami |
| 6,015,590 | A | 1/2000 | Suntola et al. |
| 6,104,074 | A | 8/2000 | Chen |
| 6,113,977 | A | 9/2000 | Soininen et al. |
| 6,139,700 | A | 10/2000 | Kang et al. |
| 6,188,134 | B1 | 2/2001 | Stumborg et al. |
| 6,200,389 | B1 | 3/2001 | Miller et al. |
| 6,200,893 | B1 | 3/2001 | Sneh |
| 6,203,613 | B1 | 3/2001 | Gates et al. |
| 6,270,572 | B1 | 8/2001 | Kim et al. |
| 6,342,277 | B1 | 1/2002 | Sherman |
| 6,482,262 | B1 | 11/2002 | Elers et al. |
| 6,511,539 | B1 | 1/2003 | Raaijmakers |
| 6,800,383 | B1 | 10/2004 | Lakhotkin |
| 6,838,125 | B2 * | 1/2005 | Chung et al. ............... 427/562 |
| 6,863,727 | B1 | 3/2005 | Elers et al. |
| 6,936,535 | B2 * | 8/2005 | Kim et al. ................. 438/656 |
| 7,144,806 | B1 | 12/2006 | Fair et al. |
| 7,211,507 | B2 * | 5/2007 | Dunn et al ................. 438/627 |
| 2003/0219942 | A1 | 11/2003 | Choi et al. |
| 2004/0231799 | A1 | 11/2004 | Lee et al. |
| 2005/0095443 | A1 | 5/2005 | Kim |
| 2006/0019494 | A1 * | 1/2006 | Cao et al. ................... 438/680 |
| 2006/0063395 | A1 * | 3/2006 | Lee ............................ 438/785 |
| 2006/0211224 | A1 * | 9/2006 | Matsuda .................... 438/493 |
| 2006/0251812 | A1 * | 11/2006 | Kang et al. .............. 427/248.1 |

FOREIGN PATENT DOCUMENTS

| | | |
|---|---|---|
| EP | 0 528 779 A1 | 2/1993 |
| EP | 0 528 779 B1 | 2/1993 |
| EP | 0 442 490 B1 | 5/1995 |
| EP | 0 526 779 B1 | 10/1995 |
| EP | 0 899 779 A2 | 3/1999 |
| EP | 0 899 779 A3 | 3/1999 |
| JP | 8 264 530 A2 | 10/1996 |
| KR | 2001-88044 | 12/2001 |
| KR | 2002-31160 | 6/2002 |
| KR | 2002-87192 | 12/2002 |
| KR | 2003-5727 | 1/2003 |
| KR | 2003-14115 | 3/2003 |
| KR | 2003-14117 | 3/2003 |
| KR | 2003-33234 | 5/2003 |
| KR | 2003-40758 | 6/2003 |
| WO | WO 96/17107 | 6/1996 |
| WO | WO 00/01006 | 6/2000 |
| WO | WO 00/63957 | 10/2000 |
| WO | WO 03102265 | 11/2003 |
| WO | WO 2006093260 | 8/2006 |

OTHER PUBLICATIONS

Hiltunen et al., "Nitrides of titanium, niobium, tantaluma and molybdenum grown as thin films by the atomic layer epitaxy method," Thin Solid Films, 166:149-154 (1988).

Jeon, H., et al., "A Study on the Characteristics of TiN Film Deposited by Atomic Layer Chemical Vapor Deposition Method," J. Vac. Sci. Technol. A, 18(4), 1595-1598 (2000).

Klaus, J.W., et al., "Atomically controlled growth of tungsten and tungsten nitride using sequential surface reactions," Appl. Surf. Science 162-163; 479-471 (2000).

Klaus, J.W., et al., "Atomic layer deposition of tungsten nitride films using sequential surface reactions," Journal of the Electrochemical Soc., 147(3):1175-1181 (2000).

Klaus, J.W., et al., "Atomic layer deposition of tungsten using sequential surface chemistry with a sacrificial stripping reaction," Thin Solid Films, 360:145-153 (2000).

Klaus, J.W., et al., "Atomic layer deposition of tungsten and tungsten nitride using sequential surface reactions," : AVS 46$^{th}$ International Symposium, Seattle, WA, abstract TF-TuM6 (1999).

Ritala et al., "Atomic layer epitaxy growth of TiN thin films," J. Electrochem. Soc. 142(8):2731-2737 (1995).

Park J-S et al., "Plasma-enhanced atomic layer deposition of Ta-N thin films" Journal of the Electrochemical Society, Electrochemical Society, Manchester, New Hampshire, US, vol. 149, No. 1, Jan. 2002, pp. C28-C32, XP002268295, ISSN: 0013-4651.

European Search Report, European Patent Application No. 08 000 724.8.

* cited by examiner

PLASMA-ENHANCED ALD OF TANTALUM NITRIDE FILMS

REFERENCE TO RELATED APPLICATIONS

The present application is related to U.S. patent application Ser. No. 10/110,730 to Elers et al, filed Apr. 11, 2002, now U.S. Pat. No. 6,863,727, which is entirely incorporated by reference herein.

BACKGROUND OF THE INVENTION

1. Field of the Invention

The present invention relates to metal nitride thin films. In particular, the invention concerns methods of growing tantalum nitride thin films by Atomic Layer Deposition ("ALD").

2. Description of the Related Art

The integration level of components in integrated circuits is increasing, which rapidly places a demand for a decrease of the size of integrated circuit (IC) components and interconnects. Design rules are setting the feature sizes to $\leq 0.2$ µm, making complete film coverage on deep bottoms and vias difficult to obtain.

Integrated circuits contain interconnects, which are usually made of aluminium (Al) or copper (Cu). Cu is particularly prone to diffusion or electromigration into surrounding materials. Diffusion may adversely affect the electrical properties of the IC, causing active components to malfunction. Diffusion of metals from interconnects into active parts of the device is prevented with an electrically conductive diffusion barrier layer. Preferred diffusion barriers are conductive films, such as, e.g., TiN, TaN and WN films.

Stoichiometric TaN has good electrical conductivity, whereas $Ta_3N_5$ (dielectric phase) has poor electrical conductivity. Metallic TaN has been used as a copper diffusion barrier in IC metallization and can be used as an n-type metal electrode for a CMOS transistor.

Metallic TaN has been used as a copper diffusion barrier in the IC metallization. Other IC application could be a n-type metal electrode for CMOS transistors. There are also other applications outside IC.

Atomic layer deposition (ALD), sometimes called atomic layer epitaxy (ALE), is a self-limiting process, utilizing alternating and sequential pulses of reactants. The deposition conditions and reactants are selected to ensure self-saturating reactions, such that an adsorbed layer in one pulse leaves a surface termination that is non-reactive with the gas phase reactants of the same pulse. A subsequent pulse of different reactants reacts with the previous termination to enable continued deposition. Thus, each cycle of alternated pulses leaves a surface concentration of no more than about one molecular layer of the desired material. The growth rate depends, in part, on the number of reactive sites. Typically, the number of reactive sites is such that less than a complete monolayer (ML) deposits in each cycle. With ALD, deposition of highly conformal thin films is possible. The principles of ALD type processes have been presented by T. Suntola, e.g., in the Handbook of Crystal Growth 3, Thin Films and Epitaxy, Part B: Growth Mechanisms and Dynamics, Chapter 14, Atomic Layer Epitaxy, pp. 601-663, Elsevier Science B.V. 1994, the disclosure of which is incorporated herein by reference in its entirety.

In a typical ALD or thermal ALD process for depositing thin films, one deposition cycle comprises exposing the substrate to a first precursor, removing unreacted first reactant and reaction by-products from the reaction chamber, exposing the substrate to a second precursor, followed by a second removal step. Halide precursors, such as $TiCl_4$ and $HfCl_4$ (both volatile), are commonly used as precursors in ALD deposition processes because these precursors are inexpensive and relatively stable, but at the same time reactive towards different types of surface groups. Where formation of metal nitride thin films is desired, ammonia ($NH_3$) is typically used as a second precursor, though other nitrogen-containing compounds may also be used.

The separation of precursors by inert gas prevents gas-phase reactions between reactants and enables self-saturating surface reactions, leading to film growth which does not require strict temperature control of the substrates or precise dosage control of the precursors. Surplus chemicals and reaction by-products are generally removed from the reaction chamber before the next reactive chemical pulse is introduced into the chamber. Undesired gaseous molecules can be effectively expelled from the reaction chamber by maintaining a substantially high gas flow rate of an inert purging gas. The purging gas directs the excess reactant molecules toward the vacuum pump used for maintaining a suitable pressure in the reaction chamber. ALD advantageously provides accurate control of thin film growth.

Formation of metal nitride layers by ALD is known in the art. A three-step method for forming a metal nitride layer using ALD is described in U.S. Pat. No. 6,863,727, issued Mar. 8, 2005, the entire disclosure of which is incorporated herein by reference. According to this method, vapor-phase pulses of a metal source chemical, a boron-containing reducing agent and a nitrogen source chemical are alternately and sequentially introduced into a reaction space.

It is also known that a plasma may be used as one of the reactants in an ALD process. Such a process is commonly referred to as plasma-enhanced ALD ("PEALD"). A reactor configured for PEALD is described in U.S. patent application No. 2004/0231799, filed Feb. 6, 2004, the entire disclosure of which is incorporated herein by reference. The PEALD reactor comprises a showerhead including an RF electrode in electrical contact with the showerhead. Plasma is generated between the showerhead (positive electrode) and the substrate (negative electrode) when a gas is introduced into the reactor and power is applied to the showerhead through the RF electrode.

While it may be desirable to use a plasma-enhanced process for depositing metal nitrides, if one of the reactants in the three-step ALD method disclosed in the '727 patent is substituted with a plasma-excited species, conductive metal nitride films (e.g., MN, where M is a metal and N is nitrogen), are formed throughout the reaction space, leading to electrical shorts that may impede, even prevent, plasma generation. This can lead to significant downtime and an increase in processing costs.

SUMMARY OF THE INVENTION

According to some embodiments of the invention, atomic layer deposition (PEALD) processes for growing a tantalum nitride thin film over a substrate in a reaction space are provided. Preferably the thin film is conductive. The processes comprise alternately and sequentially contacting the substrate in a reaction space with spatially and temporally separated vapor phase pulses of a tantalum source material, plasma-excited species of hydrogen ($H_2$) and a nitrogen source material. The order of providing the reactants can be varied.

ALD processes for growing a tantalum nitride film over a substrate in a reaction space can comprise the sequential steps of a) feeding a vapor-phase pulse of a tantalum source chemical into the reaction space; b) removing excess tantalum source chemical and reaction by-products, if any, from the reaction space; c) feeding a vapor-phase pulse of a hydrogen ($H_2$) plasma into the reaction space; d) removing excess hydrogen plasma and reaction by-products, if any, from the reaction space; e) feeding a vapor-phase pulse of a nitrogen source chemical into the reaction space; and f) removing excess nitrogen source chemical and reaction by-products, if any, from the reaction space.

According to some embodiments, the nitrogen source chemical is the next reactant provided after the tantalum source chemical. These processes preferably comprise the sequential steps of a) feeding a vapor-phase pulse of a tantalum source chemical into the reaction space; b) removing excess tantalum source chemical and reaction by-products, if any, from the reaction space; c) feeding a vapor-phase pulse of a nitrogen source chemical into the reaction space; d) removing excess nitrogen source chemical and reaction by-products, if any, from the reaction space; e) feeding a vapor-phase pulse of a hydrogen ($H_2$) plasma into the reaction space; and f) removing excess hydrogen plasma and reaction by-products, if any, from the reaction space.

According to other embodiments of the invention, methods for depositing tantalum nitride films, preferably conductive tantalum nitride films, using a plasma-enhanced atomic layer deposition (PEALD) process are provided. The methods comprise providing a substrate in a reaction space and alternately and sequentially contacting the substrate with spatially and temporally separated vapor phase pulses of a tantalum source chemical, plasma-excited species of hydrogen and a nitrogen source chemical. Plasma parameters are selected such that a conductive tantalum nitride film is deposited essentially only over the substrate and a dielectric tantalum nitride film is deposited elsewhere in the reaction space.

All of these embodiments are intended to be within the scope of the invention herein disclosed. These and other embodiments of the present invention will become readily apparent to those skilled in the art from the following detailed description of some preferred embodiments and reference to the attached FIGURE, the invention not being limited to any of the particular preferred embodiments disclosed.

BRIEF DESCRIPTION OF THE DRAWINGS

The invention will be better understood from the Detailed Description of the Preferred Embodiments and from the appended drawing, which is meant to illustrate and not to limit the invention.

DETAILED DESCRIPTION OF THE PREFERRED EMBODIMENTS

Figure 1:
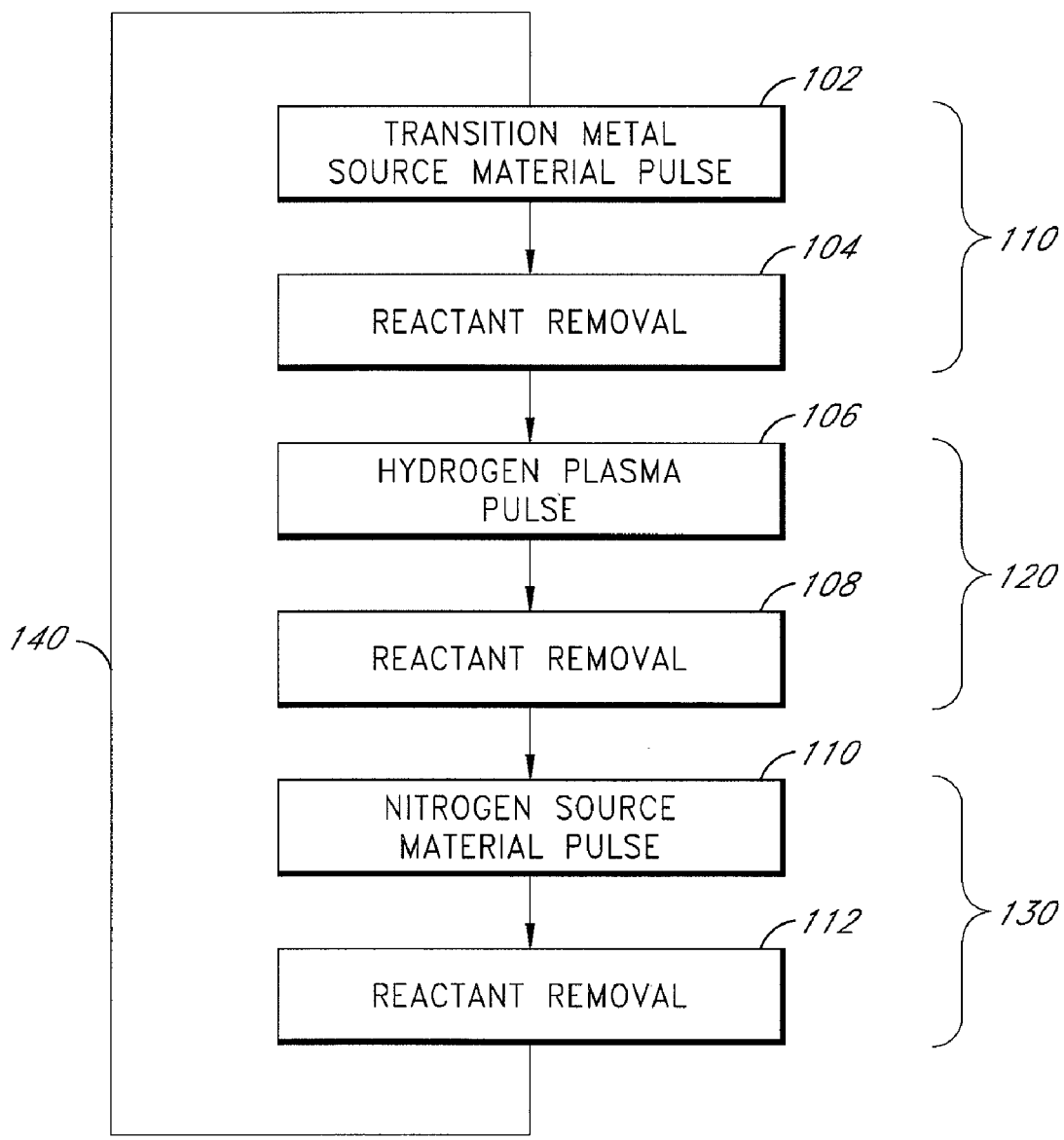
FIG. 1 is a block diagram of a pulsing sequence according to a preferred embodiment of the invention.

Tantalum nitride films can be controllably formed over a substrate by using a hydrogen plasma in the reaction space and in view of the substrate surface. By depositing a metallic film over a substrate and reducing the film with a hydrogen plasma either before or after nitridation, a conductive metal nitride film (e.g., $Ta_xN_y$, with $x \geq y$) can be formed over the substrate surface, while a non-conductive (or dielectric) metal nitride film (e.g., $Ta_xN_y$, with $x<y$) is formed elsewhere. For example, stoichiometric (and conductive) TaN can be formed using hydrogen plasma as an intermediate reducing agent while a dielectric (non-conductive) phase of tantalum nitride, e.g., $Ta_3N_5$, is formed in the absence of the plasma (for example, in parts of the reaction space where hydrogen plasma is not present). Thus, methods according to preferred embodiments of the invention allow conductive tantalum nitride films to be controllably formed over a substrate surface and not over other surfaces (in some cases conductive surfaces) of the reaction space, thereby reducing or even preventing electrical shorts and equipment downtime. The films grown can be used, for example, as components of integrated circuits, such as diffusion barriers in IC metallization and n-type metal electrodes for CMOS transistors.

DEFINITIONS

In the context of the present invention, "an ALD process" generally refers to a process for producing thin films over a substrate molecular layer by molecular layer using self-saturating chemical reactions. The general principles of ALD are disclosed, e.g., in U.S. Pat. Nos. 4,058,430 and 5,711,811, the entire disclosures of which are incorporated herein by reference. In a typical ALD process, gaseous reactants are conducted into a reaction chamber (or reaction space) of an ALD type reactor where they contact a substrate located in the chamber to provide a surface reaction. The pressure and the temperature of the reaction chamber are adjusted to a range where physisorption (i.e., condensation of gases) and thermal decomposition of the precursors are avoided. In addition, reactants that do not react with themselves are selected. Consequently, only up to one monolayer (i.e., an atomic layer or a molecular layer) of material is deposited at a time during each pulsing cycle. The actual growth rate of the thin film, which is typically presented as Å/pulsing cycle, depends, for example, on the number of available reactive surface sites and the bulkiness of the reactant molecules. That is, once all available binding sites are filled, no additional surface reactions are possible. Gas phase reactions between precursors and any undesired reactions of by-products are inhibited because reactant pulses are separated from each other by time and the reaction chamber is purged with an inert gas (e.g., nitrogen, argon, $H_2$, or He) and/or evacuated, e.g., using a vacuum pump, between reactant pulses to remove surplus (or excess) gaseous reactants and reaction by-products, if any.

"Reaction space" is used to designate a reactor or reaction chamber, or an arbitrarily defined volume therein, in which conditions can be adjusted to effect thin film growth over a substrate by ALD. Typically the reaction space includes surfaces subject to all reaction gas pulses from which gases or particles can flow to the substrate, by entrained flow or diffusion, during normal operation. The reaction space can be, for example, the reaction chamber in a single-wafer ALD reactor or the reaction chamber of a batch ALD reactor, where deposition on multiple substrates takes place at the same time. The reactor is preferably configured for plasma generation, either in situ or remotely.

"Plasma-excited species" refers to radicals, ions or other excited species generated via application (or coupling) of energy to a reactant gas. Energy may be applied via a variety of methods, such as, e.g., induction, ultraviolet radiation, microwaves and capacitive coupling. The plasma generator may be a direct plasma generator (i.e., in situ or direct plasma generation) or a remote plasma generator (i.e., ex situ or remote plasma generation). In the absence of coupling energy, plasma generation is terminated. Plasma-excited species include, without limitation, hydrogen radicals. For in situ plasma generation, plasma-excited species of a particular vapor phase chemical (e.g., $H_2$) are formed in a reaction space comprising a substrate to be processed. For remote plasma generation, plasma-excited species are formed external to the reaction space comprising the substrate.

"Adsorption" is used to designate a chemical attachment of atoms or molecules on a surface.

"Substrate" is used to designate any workpiece on which deposition is desired. Typical substrates include, without limitation, silicon, silica, coated silicon, copper metal and nitride.

"Surface" is used to designate a boundary between the reaction space and a feature of the substrate.

"Thin film" means a film that is grown from elements or compounds that are transported as separate ions, atoms or molecules via vacuum, gaseous phase or liquid phase from the source to the substrate. The thickness of the film depends upon the application and may vary in a wide range, preferably from one atomic layer to 1,000 nm or more. In some embodiments, the thin film is less than about 20 nm in thickness, even more preferably less than about 10 nm and most preferably less than about 5 nm.

"Metal nitride thin film" designates a thin film that comprises one or more metals and nitrogen. "Tantalum nitride" thin films comprise tantalum, but may comprise one or more other transition metals.

Subscripts "x" and "y" in the formula $M_xN_y$ are used to designate the composition of a metal nitride film having a wide range of phases with varying metal-to-nitrogen ratios. 'M' can comprise one metal (e.g., Ta) or a plurality of metals (e.g., Ta and Ti). The formula $M_xN_y$ is averaged over an entire film. When 'x' is equal to 'y', the metal nitride film (MN) is stoichiometric. When 'x' is not equal to 'y', the metal nitride film is non-stoichiometric. As an example, a stoichiometric tantalum nitride film may have the formula TaN, and a non-stoichiometric tantalum nitride film may have the formula $Ta_3N_5$ (i.e., five nitrogen atoms coordinated to three tantalum atoms). In a "conductive" metal nitride film, the number of metal atoms (M) is greater than or equal to the number of nitrogen atoms (N), i.e., $x \geq y$.

Metal Nitride Deposition Process

The methods presented herein allow controlled deposition of conformal and conductive metal (e.g., tantalum) nitride thin films over a substrate surface. Deposition of conductive films on other surfaces in a reactor or reaction space, such as on the showerhead, is preferably reduced or prevented. In preferred embodiments, tantalum nitride thin films are deposited from halogen-containing chemicals. Geometrically challenging applications, such as deposition in high aspect ratio trenches, are also possible due to the self-limiting nature of the surface reactions.

According to some preferred embodiments, an atomic layer deposition (ALD) type process is used to form tantalum nitride thin films over a substrate, such as an integrated circuit workpiece. In some embodiments, a substrate or workpiece placed in a reaction space is subjected to alternately repeated surface reactions of a metal source chemical, a hydrogen plasma and a nitrogen source chemical.

Preferred ALD methods described herein include PEALD methods, in which plasma is used as a reactant, and in some cases "thermal" ALD, in which the substrate is heated during certain processing steps.

Preferably, each ALD cycle comprises three distinct deposition steps or phases, each employing a different reactant. Although referred to as the "first," "second" and "third" reactants, these designations do not imply that the reactants have to be introduced in this order. In some embodiments, an ALD cycle may start with the second or third reactant. A first reactant will chemically adsorb ("chemisorb") on the substrate surface in a self-limiting manner and thus will form no more than about one monolayer on the substrate surface. The first reactant preferably comprises a transition metal ("metal") species desired in the layer being deposited. In preferred embodiments, the metal nitride film to be formed comprises a metal selected from the group consisting of W, Mo, Cr, Ta, Nb, V, Hf, Zr and Ti. In some embodiments, it may also comprise a second transition metal or a plurality of transition metals, preferably selected from the group consisting of W, Mo, Cr, Ta, Nb, V, Hf, Zr and Ti.

In some embodiments, the metal source chemical or material, also referred to herein as the "metal reactant," is a halide and forms a molecular layer terminated with halogen ligands on (or over) the substrate. In this case, the metal source material may be selected from the group consisting of metal bromides, metal chlorides, metal fluorides and metal iodides. In some embodiments, the metal nitride film comprises tantalum and the tantalum source chemical used to deposit the film is selected from the group consisting of tantalum bromides, tantalum chlorides, tantalum fluorides and tantalum idodides. In other embodiments, the metal source chemical is a metal organic compound, such as, e.g., an organic compound of tantalum. As an example, a pentakis (dialkylamido) compound can be used as a tantalum source chemical. In some embodiments, metallocene derivatives of a metal (e.g., $TaCp_2C_xH_y$) may be used.

A second reactant preferably contains another species desired in the layer being deposited, such as nitrogen. The second reactant is typically not a halide, although in some embodiments it may be. In a preferred embodiment, the second reactant is selected from the group consisting of ammonia ($NH_3$) and its salts, hydrogen azide ($HN_3$) and the alkyl derivates thereof, hydrazine ($N_2H_4$) and salts of hydrazine, alkyl derivates of hydrazine, nitrogen fluoride $NF_3$, primary, secondary and tertiary amines, nitrogen radicals, and excited state nitrogen ($N_2^*$), wherein * is a free electron capable of bonding. In other embodiments, the second reactant is selected from the group consisting of tertbutylamide, ammonium fluoride, ammonium chloride, $CH_3N_3$, hydrazine hydrochloride dimethyl hydrazine, hydroxylamine hydrochloride, methylamine, diethylamine and triethylamine. In a preferred embodiment, the second reactant is ammonia ($NH_3$).

A third reactant is a reducing agent. In preferred embodiments, the third reactant comprises hydrogen ions and/or radicals (i.e., excited species of hydrogen) and may be, for example, a hydrogen ($H_2$) plasma. The hydrogen plasma may be generated in the reactor e.g., in a showerhead-type PEALD reactor as disclosed in U.S. patent application No. 2004/0231799, as mentioned above. In other embodiments, hydrogen plasma is generated externally (i.e., remote plasma generation) and directed to the reaction space. In some embodiments, the third reactant reacts with a metallic film and removes ligands (e.g., halides) deposited by the metal source chemical. As an example, the third reactant may remove chlorine atoms from a metal or metal nitride film.

In preferred embodiments, plasma parameters are selected such that hydrogen plasma is substantially directed to the surface of the substrate. Plasma parameters include, without limitation, radio frequency ("RF") power on time, RF power amplitude, RF power frequency, reactant concentration, reactant flow rate, reaction space pressure, total gas flow rate, reactant pulse durations and separations, and RF electrode spacing. As an example, the spacing between the showerhead and the substrate surface may be selected to direct the hydrogen plasma predominantly to the substrate surface. In this manner, exposure of hydrogen plasma at other locations of the reaction space (e.g., reaction space walls not in view of the hydrogen plasma) may be minimized, if not eliminated. Consequently, a conductive film, preferably a conductive tantalum nitride film, is formed over a substrate, and deposition at reaction space locations not contacted by the hydrogen plasma is limited to non-conductive material.

In one phase of the ALD cycle ("the metal phase" or the "first phase"), a metal reactant (i.e., metal source material) is supplied to the reaction chamber and chemisorbs to the substrate surface. The reactant supplied in this phase is selected such that, under the preferred conditions, the amount of reactant that can adsorb to the surface is determined by the number of available binding sites on the surface and by the physical size of the chemisorbed species (including ligands). The metal reactant may be provided with the aid of an inert carrier gas (e.g., He or Ar). The chemisorbed layer left by a pulse of the metal reactant is self-terminated with a surface that is non-reactive with the remaining chemistry of that pulse. This phenomenon is referred to herein as "self-saturation." One of skill in the art will recognize that the self-limiting nature of this phase makes the entire ALD cycle self-limiting. Excess reactant and reactant by-products (if any) are removed from the reaction space, for example by purging with a purge gas and/or a vacuum generated by a pumping system. If the metal reactant is supplied with the aid of a carrier gas, reactant (and by-product) removal may entail stopping the flow of the metal reactant and continuing to supply the carrier gas (i.e., the carrier gas serves as the purge gas).

Maximum step coverage on the workpiece surface is obtained when no more than about a single molecular layer of metal source material molecules is chemisorbed in each self-limiting pulse. Due to the size of the chemisorbed species and the number of reactive sites, less than a monolayer (ML) is typically deposited in each pulse of metal reactant.

In the next phase of the cycle, a pulse of a second source chemical is provided that reacts with the metal-containing molecules left on the substrate surface by the preceding pulse. The second source chemical preferably comprises nitrogen (nitrogen source material). Thus, nitrogen is incorporated into the thin film by the interaction of the second source chemical with the monolayer left by the metal reactant. This phase is referred to herein as "the second phase" or the "nitrogen-contributing phase." In preferred embodiments, the second source chemical is a nitrogen-containing compound (e.g., $NH_3$) and its reaction with the chemisorbed metal species produces a metal nitride film on the substrate.

Excess second source chemical and reaction by-products, if any, are removed from the reaction space by purging and/or evacuating with the aid of a pumping system. Purging may be performed using an inert gas, such as argon (Ar) or helium (He).

The third phase of the ALD cycle comprises providing a reducing agent. In preferred embodiments, the reducing agent is capable of donating electrons to the transition metal comprising the deposited thin film, thereby decreasing the oxidation state of the transition metal. In preferred embodiments, the reducing agent is a hydrogen plasma, which includes excited species of hydrogen (e.g., hydrogen radicals). Thus, in some embodiments, hydrogen plasma removes halide atoms (residues) from a metal nitride film, thereby reducing the metal nitride film. For example, if the transition metal is Ta and a dielectric phase of tantalum nitride (e.g., $Ta_3N_5$) is deposited on a substrate surface, exposure of the film to hydrogen plasma reduces the oxidation state of Ta from '+5' to '+3', producing a conductive tantalum nitride thin film.

Although referred to as the "second phase" and the "third phase," these labels are for convenience and do not indicate the actual order of the phases in each ALD cycle. Thus, after the "first phase," the ALD cycle may be followed by either one of the second or third phases. As a result, in some embodiments, a pulsing sequence may be: transition metal source material pulse/hydrogen plasma pulse/nitrogen source material pulse. In other embodiments, the pulsing sequence may be: transition metal source material pulse/nitrogen source material pulse/hydrogen plasma pulse. The reactant pulses are preferably separated by purge steps in which excess reactants and/or reaction by-products (if any) are removed, preferably with the aid of a purge gas and/or evacuation using a pumping system, as described above. Additionally, each of the phases (either in combination with another phase or individually) may be repeated a predetermined number of times prior to the other phases. For example, the first phase and the second phase, performed sequentially, can be repeated five times prior to the third phase. As another example, the first phase and the third phase, performed sequentially, can be repeated five times prior to the second phase. The skilled artisan will understand that the number of times the first phase and third phase (or second phase) are repeated is selected to permit formation of a compositionally uniform metal nitride film (see below). Further, it will be appreciated that the number of times the first two phase are repeated is preferably such that the metal nitride film formed has a thickness that allows reduction of a substantial portion of the film in the third phase. In one embodiment, the first two phases can be repeated until a metal nitride thin film with a thickness of at most 50 nanometers (nm) is formed, thus permitting sufficient reduction of the metal nitride thin film in the third phase.

Additionally, a phase is generally considered to immediately follow another phase if only a purge or other reactant removal step intervenes.

In one embodiment, an ALD cycle comprises:

1. providing a transition metal halide to the reaction space;
2. purging and/or evacuating excess transition metal halide and reaction by-products;
3. providing a nitrogen source material to the reaction space
4. purging and/or evacuating excess nitrogen source material and reaction by-products;
5. providing hydrogen plasma to the reaction space; and
6. purging and/or evacuating excess hydrogen plasma and reaction by-products.

In preferred embodiments, providing hydrogen plasma (step 5) includes introducing hydrogen gas into the reaction space, the reaction space comprising the substrate, and generating hydrogen plasma in situ (i.e., in the reaction space). Power is provided to an RF electrode to generate the plasma. After a desired exposure time, plasma production is terminated and reaction by-products (if any) are removed using a purge and/or evacuation step (step 6). In other embodiments, hydrogen plasma is generated at a remote location in fluid communication with the reaction space and the hydrogen plasma is directed into the reaction space. In preferred embodiments, regardless of the method of hydrogen plasma generation, hydrogen plasma is predominantly directed at the substrate surface.

In some embodiments, step 5 is included in each ALD cycle. However, in other embodiments, steps 1-4 can be repeated several times before step 5 is introduced. Thus, in some embodiments steps 1-4 are repeated up to 10 times before step 5 is included. In other embodiments steps 1-4 are repeated up to 100 or even 1000 or more times before step 5 is included. The number of repeats of steps 1-4 is preferably chosen to ensure that the metal nitride film has a thickness that will permit reduction of substantially all of the film in step 5.

By directing hydrogen plasma to the substrate surface, preferred methods advantageously permit formation of a conductive phase of tantalum nitride (e.g., TaN) film over a substrate and formation of dielectric phase of tantalum nitride (e.g., $Ta_3N_5$) film over reactor walls, which may include the showerhead described above. Plasma parameters may be selected to limit exposure of the hydrogen plasma predominantly to the substrate surface.

In some embodiments, the substrate is heated during formation of the conductive tantalum nitride film. In such a case, the substrate temperature is selected to be from about 250° C. to 400° C. Additionally, during film formation the reactor pressure is maintained between about 0.5 torr and 10 torr.

In some cases, plasma parameters (e.g., plasma power) and or the plasma pulse duration may be adjusted to reduce the level of impurities (e.g., halides, oxygen) in a tantalum nitride film. Any impurities that remain in the tantalum nitride film following deposition may be removed via exposure to hydrogen plasma in a post-deposition step. In some cases, exposure of the substrate to plasma-excited species of hydrogen, either during a deposition cycle or post deposition, for 1 second or longer removes most impurities from the conductive tantalum nitride film.

With reference to FIG. 1, in an exemplary embodiment of the invention, after initial surface termination, if necessary or desired, a first reactant or source material is supplied 102 to the substrate. In accordance with a preferred embodiment, the first reactant pulse comprises a carrier gas and a volatile halide species that is reactive with the substrate surface of interest. The volatile halide species comprises a metal species that is to form part of the deposited layer. Accordingly, a halogen-containing species adsorbs upon the workpiece surfaces. In the illustrated embodiment, the first reactant is a transition metal source material, such as a metal halide, and the thin film being formed comprises a metallic material, preferably conductive metal nitride. The first reactant pulse self-saturates the workpiece surfaces in such a way that any excess constituents of the first reactant pulse do not further react with the monolayer formed by this process. Self-saturation is facilitated by ligands, such as halide tails, terminating the monolayer, which protect the layer from further reaction.

The first reactant is then removed 104 from the reaction space. Step 104 may entail stopping the flow of the first reactant or chemistry while continuing to flow a carrier gas, preferably an inert gas (e.g., He or Ar), for a sufficient time to diffuse or purge excess reactants and reactant by-products from the reaction space, preferably with greater than about two reaction chamber volumes of the purge gas, more preferably with greater than about three chamber volumes. In such a case, the carrier gas serves as the purge gas during the reaction removal step 104. Preferably, the removal 104 comprises continuing to flow purge gas for between about 0.1 seconds and 20 seconds after stopping the flow of the first reactant pulse. Inter-pulse purging is described in U.S. Pat. No. 6,511,539, filed Sep. 8, 1999, entitled APPARATUS AND METHOD FOR GROWTH OF A THIN FILM, the entire disclosure of which is incorporated herein by reference. In other arrangements, the chamber may be pumped down between alternating chemistries. See, for example, PCT publication number WO 96/17107, published Jun. 6, 1996, entitled METHOD AND APPARATUS FOR GROWING THIN FILMS, the entire disclosure of which is incorporated herein by reference. Together, the adsorption 102 and reactant removal 104 represent a first phase 110 in an ALD cycle. The first phase in the illustrated ALD cycle is thus the metal phase.

With continued reference to FIG. 1, a second reactant or source chemical is pulsed 106 to the workpiece. The second chemistry desirably reacts with or adsorbs upon the monolayer left by the first reactant. In the illustrated embodiment, the second reactant is a hydrogen plasma and the second reactant pulse 106 comprises generating hydrogen plasma in the reactor or supplying hydrogen plasma generated remotely. The hydrogen plasma reduces the oxidation state of the metal in the film formed in the first phase. Additionally, hydrogen atoms in the hydrogen plasma react with and remove halide atoms from the monolayer formed in the first phase.

After a time period sufficient to reduce the monolayer, plasma generation is terminated and any reaction by-products (preferably also volatile) are removed 108 from the reaction space, preferably by a purge gas pulse. The removal can be as described for step 104. Together, steps 106 and 108 represent a second phase 120 of the illustrated ALD process, which can also be referred to as the reduction phase.

Next, a third reactant or source material pulse is supplied 110 to the workpiece. The third reactant or chemistry desirably reacts with or adsorbs upon the monolayer left by the first and second reactants. In the illustrated embodiment, this third reactant pulse 110 comprises supplying a carrier gas with the third source material to the reaction space (or chamber). In particular embodiments, where the first reactant comprises a metal halide and the second reactant includes plasma-excited species of hydrogen (e.g., hydrogen radicals), the third reactant pulse reacts with the growing film over the substrate surface to leave no more than about a monolayer of a metal nitride. In preferred embodiments, the third reactant is a nitrogen source material, such as, e.g., ammonia ($NH_3$).

After a time period sufficient to completely saturate and react the monolayer with the third reactant 110, any excess third reactant is removed 112 from the workpiece. As with the removal 104 of the first reactant, this step 112 preferably comprises stopping the flow of the third chemistry and continuing to flow carrier gas for a time period sufficient for excess reactants and volatile reaction by-products from the third reactant pulse to diffuse out of and be purged from the reaction space. Together, the third reactant pulse 110 and removal 112 represent a third phase 130 in the illustrated process, and can also be considered a nitrogen-contributing phase.

The first phase 110, second phase 120 and third phase 130 may be repeated 140 until a conductive tantalum nitride film of desired thickness is formed over the substrate. As an example, the three phases may be repeated 10 times, 100 times or 1000 times to form a conductive metal nitride film with thickness as desired.

The thickness of the tantalum nitride film can vary with application. For example, in one embodiment as a copper barrier layer in IC metallization, the tantalum nitride thin film can have a thickness of about 15 nanometers (nm) or less. In other embodiments for metal gate applications, the tantalum nitride film can have a thickness between about 1 nm and 10 nm. In still other embodiments for MIM metal electrode applications, the tantalum nitride film can have a thickness between about 5 nm and 30 nm.

As mentioned above, in some embodiments the first phase and second phase, performed in sequence, may be repeated a predetermined number of times before the third phase. For example, the first phase and second phase may be repeated five times or ten times prior to the third phase. In this manner, a reduced metal film with thickness greater than one monolayer is formed. The skilled artisan will understand, however, that the number of times the first phase and second phase are repeated is selected to permit formation of a compositionally uniform conductive metal nitride film over the substrate. That is, the number of repetitions (hence the thickness) is carefully selected to permit complete nitridation of the reduced metal film during the third phase.

In an alternative embodiment of the invention (not shown), the first phase is followed by the third phase. In this case, supply or pulse of the nitrogen source material 110 immediately follows the step of removing excess transition metal source material and by-products 104. After a time period sufficient to completely react with the monolayer, the nitrogen source material and reaction by-products (if any) are removed from the reaction space, preferably by a purge gas pulse. The removal step is followed by the second phase 120, in which case hydrogen plasma is pulsed to reduce the metal nitride film. As an alternative, the first phase and third phase, performed in sequence, may be repeated a predetermined number of times before the second phase. For example, the first phase and third phase may be repeated five times or ten times prior to the second phase. In this manner, a metal nitride film with thickness greater than one monolayer is formed. In some embodiments, the metal nitride film at this stage may be non-conductive. Subsequently performing the second phase produces a conductive metal nitride film. The skilled artisan will understand, however, that the number of times the first phase and third phase are repeated is selected to permit formation of a compositionally uniform conductive metal nitride film.

It will be understood that a conductive metal nitride film need not be stoichiometric. Conductive metal nitride films can have metal-to-nitrogen ratios greater than or equal to one. In some cases, conductive metal nitride films can be metal rich, with metal-to-nitrogen ratios substantially greater than one. On the other hand, non-conductive (or dielectric) metal nitride films have a metal-to-nitrogen ratio less than one. It will be appreciated that preferred methods for forming a metal nitride films over substrates can be used to form conductive metal nitride films with metal-to-nitrogen ratios as desired. Preferably, process parameters (e.g., duration of nitrogen source chemical pulse) are selected to produce a metal nitride film of a desired metal-to-nitrogen ratio.

Thus, according to the foregoing embodiments, a conductive metal nitride film is controllably formed over the substrate surface while a non-conductive (or dielectric) metal nitride film is formed elsewhere (e.g., reaction space walls). It will be appreciated that conductive metal nitride films formed according to methods of preferred embodiments can have resistivities (and conductivities) that vary with film properties (e.g., composition, thickness). In one embodiment, a conductive metal nitride film used as a barrier layer in an integrated circuit (IC) copper metallization process preferably has a bulk resistivity at or below about 400 $\mu\Omega$cm. Generally, resistivities are less than about 3000 $\mu\Omega$cm, preferably less than about 2000 $\mu\Omega$cm, more preferably less than about 1000 $\mu\Omega$cm, and most preferably less than about 500 $\mu\Omega$cm. In some embodiments, conductive tantalum nitride films formed according to preferred methods have resistivities preferably between about 500 $\mu\Omega$cm and 1200 $\mu\Omega$cm, more preferably about 1000 $\mu\Omega$cm.

In gate electrode applications, the bulk resistivity of a conductive metal nitride film formed according to preferred methods is preferably below the bulk resistivity of a polysilicon film of similar thickness. Polysilicon films typically have bulk resistivities from about 2,500 $\mu\Omega$cm to 3,000 $\mu\Omega$cm. Conductive metal nitride films formed according to preferred methods can have resistivities below about 2000 $\mu\Omega$cm.

The aforesaid embodiments will be discussed in the context of an example.

EXAMPLE

A conductive tantalum nitride film was deposited on a 300 mm silicon wafer in a PEALD reactor from ASM Genitech, Inc. Deposition was conducted at a substrate temperature of about 300-350° C. and a $TaF_5$ source gas temperature of about 93° C. Hydrogen ($H_2$) plasma and ammonia ($NH_3$) were used as the reducing agent and nitrogen source material, respectively. $H_2$ plasma was generated by pulsing $H_2$ into the reactor and supplying power to a plasma generator (1 KW, 13.56 MHz) while holding the plasma power at about 400 W. The sequence of gas pulses and pulsing times (milliseconds, "ms") are as follows:

(1) $TaF_5$ pulse (900 ms);
(2) Ar purge (3000 ms);
(3) $H_2$ Plasma pulse (2000-4000 ms);
(4) Ar purge (2000 ms);
(5) $NH_3$ pulse (1000-4000 ms); and
(6) Ar purge (6000 ms);

Steps (1)-(6) were repeated until a conductive tantalum nitride film of thickness between about 40 nm and 70 nm was formed on the substrate. During the pulsing sequence, a throttle valve was used to maintain the reactor pressure at about 3 torr and argon (Ar) was continuously fed over the wafer at a flow rate of about 650 sccm.

Results

ALD (thermal/plasma-enhanced) was primarily conducted at a substrate temperature of about 300° C. and results were obtained at a temperature between about 300° C.-350° C. Increasing the duration of ammonia pulse and assessing the N-to-Ta ratio (N/Ta), which varies between about 1.0 for stoichiometric tantalum nitride (i.e., TaN) and about 1.67 for dielectric tantalum nitride (e.g., $Ta_3N_5$), showed that tantalum-nitride films are grown in the stoichiometric phase. The length or duration of $TaF_5$ and $H_2$ plasma pulses were chosen such that they were sufficient to provide a saturated and completely reduced tantalum layer on the substrate prior to the ammonia ($NH_3$) pulse. Further, purge gas was supplied to aid removal of the precursors and reaction by-products. With an ammonia pulse length of about 0.5 seconds (s), 1 s, 2 s or 4 s, and using about 800-1000 cycles, a continuous yellowish metallic film was deposited on the substrate in each case.

Sheet resistance measurements were indicative of conductive tantalum nitride. The sheet resistance remained between about 100-200 ohm/$cm^2$ upon increasing the ammonia pulse length from about 0.5 s to 4 s. Such a range is within the normal variation of the sheet resistance, indicating that the N-to-Ta ratio was saturated at the 0.5 s ammonia pulse duration.

X-ray photoelectron spectroscopy (XPS) results provided support for the previous observation. According to XPS results, the N-to-Ta ratio was about equal to one at the 0.5 s ammonia pulse length. The film was slightly tantalum rich (N/Ta=0.8) but no change of the N-to-Ta ratio was observed between 0.5 s and 4 s ammonia pulse. When the deposition temperature was increased to about 350° C. and the ammonia pulse duration was held at 0.5 s, the film became more stoichiometric (N/Ta=1.0), as a result of a more favorable oxidation state of Ta (i.e., +3).

X-ray reflectometry (XRR) results indicated a growth rate of about 0.5 Å/cycle at 300° C. and about 0.6 Å/cycle at 350° C. Further, the resistivity varied with deposition temperature. For example, the resistivity was about 400 $\mu\Omega$-cm at 300° C. and about 1800 $\mu\Omega$-cm at 350° C. The N-to-Ta ratio was found to have a significant influence on electrical properties of the PEALD-deposited film.

Stoichiometric tantalum nitride (TaN) films with thicknesses between about 40 nm and 70 nm were obtained having thickness non-uniformities between about 2% (1 SIGMA) and 4% (1 SIGMA) on the 300 mm silicon wafer.

Aside from nitrogen and tantalum, XPS results showed that the TaN film contained about 2-10 atomic % fluorine and about 2-5 atomic % oxygen. The fluorine and oxygen impurities may be removed, e.g., by adjusting plasma parameters during formation of the tantalum nitride film or by post-deposition treatment with a hydrogen plasma.

In at least some of the aforesaid embodiments, any element used in an embodiment can interchangeably be used in another embodiment unless such a replacement is not feasible.

It will be appreciated by those skilled in the art that various other omissions, additions and modifications may be made to the methods and structures described above without departing from the scope of the invention. For example, while tantalum was used in preferred methods, metal nitride films formed according to preferred methods may comprise one or more other metals, such as, e.g., W, Mo, Cr, Nb, V, Hf, Zr and Ti. As an example, methods according to preferred embodiments may be used to form tungsten nitride films. All such modifications and changes are intended to fall within the scope of the invention, as defined by the appended claims.

I claim:

1. An atomic layer deposition (ALD) process for growing a tantalum nitride film over a substrate in a reaction space, comprising the sequential steps of:
   a) feeding a vapor-phase pulse of a tantalum source chemical into the reaction space;
   b) removing excess tantalum source chemical and any reaction by-products from the reaction space;
   c) feeding a vapor-phase pulse of a nitrogen source chemical into the reaction space;
   d) removing excess nitrogen source chemical and any reaction by-products from the reaction space;
   e) feeding a vapor-phase pulse of plasma-excited species of hydrogen ($H_2$) into the reaction space; and
   f) removing excess plasma-excited species of hydrogen and any reaction by-products from the reaction space.

2. The process of claim 1, further comprising repeating steps a) through f) until a tantalum nitride film of predetermined thickness is formed over the substrate.

3. The process of claim 1, wherein steps a) through d) are repeated a predetermined number of times before steps e) through f).

4. The process of claim 1, wherein removing comprises evacuating with the aid of a purge gas.

5. The process of claim 1, wherein removing comprises evacuating with a pumping system.

6. The process of claim 1, wherein feeding comprises pulsing with a carrier gas.

7. The process of claim 1, wherein the tantalum source chemical is selected from the group consisting of tantalum halides and organic compounds of tantalum.

8. The process of claim 7, wherein the tantalum source chemical includes pentakis (dialkylamido) compounds of tantalum.

9. The process of claim 7, wherein the tantalum source chemical is selected from the group consisting of tantalum bromides, tantalum chlorides, tantalum fluorides and tantalum iodides.

10. The process of claim 1, wherein the nitrogen source chemical is selected from the group consisting of ammonia ($NH_3$) and its salts, hydrogen azide ($HN_3$) and the alkyl derivates thereof, hydrazine ($N_2H_4$) and salts of hydrazine, alkyl derivates of hydrazine, nitrogen fluoride $NF_3$, primary, secondary and tertiary amines, nitrogen radicals, and excited state nitrogen ($N_2$*), wherein * is a free electron capable of bonding.

11. The process of claim 1, wherein the nitrogen source chemical is selected from the group consisting of tertbutylamide, $CH_3N_3$, hydrazine hydrochloride dimethyl hydrazine, hydroxylamine hydrochloride, methylamine, diethylamine and triethylamine.

12. The process of claim 1, wherein the substrate comprises one or more materials selected from the group consisting of silicon, silica, coated silicon, copper metal and nitride.

13. The process of claim 1, wherein the tantalum nitride film defines a diffusion barrier in an integrated circuit.

14. The process of claim 1, wherein the reaction space is a reactor configured for plasma enhanced atomic layer deposition (PEALD).

15. The process of claim 1, wherein the reaction space is a single-wafer PEALD reactor.

16. A method for depositing a conductive tantalum nitride film using a plasma-enhanced atomic layer deposition (PEALD) process, comprising:
   providing a substrate in a reaction space; and
   alternately and sequentially contacting a substrate in the reaction space with spatially and temporally separated vapor phase pulses of:
      a tantalum source chemical;
      plasma-excited species of hydrogen; and
      a nitrogen source chemical,
   wherein plasma parameters are selected such that a conductive tantalum nitride film is deposited essentially only over the substrate and a dielectric tantalum nitride film is deposited elsewhere in the reaction space.

17. The method of claim 16, wherein the plasma parameters are selected from the group consisting of RF power on time, RF power amplitude, RF power frequency, reactant concentration, reactant flow rate, reaction space pressure, total gas flow rate, reactant pulse durations and separations, and RF electrode spacing.

18. The method of claim 16, wherein the tantalum source chemical is selected from the group consisting of tantalum bromides, tantalum chlorides, tantalum fluorides and tantalum iodides.

19. The method of claim 16, wherein the nitrogen source chemical is selected from the group consisting of ammonia ($NH_3$) and its salts, hydrogen azide ($HN_3$) and the alkyl derivates thereof hydrazine ($N_2H_4$) and salts of hydrazine, alkyl derivates of hydrazine, nitrogen fluoride $NF_3$, primary, secondary and tertiary amines, nitrogen radicals, and excited state nitrogen ($N_2$*), wherein * is a free electron capable of bonding.

* * * * *